US007120085B2

(12) United States Patent
Lee

(10) Patent No.: US 7,120,085 B2
(45) Date of Patent: Oct. 10, 2006

(54) PSEUDO SRAM HAVING COMBINED SYNCHRONOUS AND ASYNCHRONOUS MODE REGISTER SET

(75) Inventor: Sang Kwon Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 112 days.

(21) Appl. No.: 10/878,326

(22) Filed: Jun. 29, 2004

(65) Prior Publication Data

US 2005/0226090 A1  Oct. 13, 2005

(30) Foreign Application Priority Data

Apr. 13, 2004  (KR) ...................... 10-2004-0025477

(51) Int. Cl.
*G11C 8/00*  (2006.01)
(52) U.S. Cl. .................................. 365/233; 365/230.08
(58) Field of Classification Search ...................... None
See application file for complete search history.

(56) References Cited

U.S. PATENT DOCUMENTS

| | | |
|---|---|---|
| 5,572,676 A | 11/1996 | Ohnishi |
| 5,787,457 A * | 7/1998 | Miller et al. ................. 711/105 |
| 5,983,252 A | 11/1999 | Clapp |
| 6,026,465 A | 2/2000 | Mills et al. |
| 6,061,759 A | 5/2000 | Guo |
| 6,697,296 B1 * | 2/2004 | Matsumoto et al. ........ 365/233 |
| 6,789,210 B1 | 9/2004 | Satoh et al. |

FOREIGN PATENT DOCUMENTS

| | | |
|---|---|---|
| JP | 09-237197 | 9/1997 |
| JP | 2000-268564 | 9/2000 |

\* cited by examiner

*Primary Examiner*—Thong Q. Le
(74) *Attorney, Agent, or Firm*—Heller Ehrman LLP

(57) ABSTRACT

A PSRAM features a mode register set (MRS) for setting a mode register at a combined synchronous and asynchronous mode. The PSRAM having a combined synchronous and asynchronous mode register set includes a MRS, a mode register control unit, a plurality of control signal buffers, an address buffer, a clock buffer, and a synchronous and asynchronous detecting unit. Here, the plurality of control signal buffers, the address buffer and the clock buffers are controlled by a chip selecting signal at an asynchronous mode, and are operated synchronously with respect to an internal clock outputted from the clock buffer regardless of the chip selecting signal at a synchronous mode.

18 Claims, 14 Drawing Sheets

US 7,120,085 B2

PSEUDO SRAM HAVING COMBINED SYNCHRONOUS AND ASYNCHRONOUS MODE REGISTER SET

BACKGROUND OF THE INVENTION

1. Field of the Invention

The present invention generally relates to a pseudo static random access memory (hereinafter, referred to as "PSRAM"), and more specifically, to a PSRAM having a mode register set (hereinafter, referred to as "MRS") for setting mode registers at a combined synchronous and asynchronous mode.

2. Description of the Prior Art

Generally, a Dynamic Random Access Memory (hereinafter, referred to as "DRAM") memorizes information with charges in a cell capacitor, transmits accumulative charges to a corresponding bit line through an access transistor, and reads data amplified by a sense amplifier.

Since a memory cell of the DRAM that comprises one access transistor and one cell capacitor occupies a small area, a memory of high capacity can be embodied with the small area.

Meanwhile, a memory device becomes smaller for high-speed operation, reduction of consumed current and miniaturization of the processing system. As the memory device becomes smaller, a memory cell capacitor also becomes smaller so that storage capacitance of the memory cell capacitor is reduced. As a result, the amount of retention charges becomes smaller although data having the same voltage level are inputted to the capacitor.

In order to compensate the reduction in the amount of retention charges, a refresh operation is periodically performed. In the refresh operation, data stored in the cell capacitor are transmitted to a bit line, amplified in a sense amplifier, and then re-written in the cell capacitor.

As result, when data retention characteristics are degraded in the miniaturized device, a refresh cycle is required to be set short in order to compensate the degradation of the data retention characteristics. However, when the refresh cycle is set short, an external processing unit cannot access the DRAM during the refresh operation, thereby degrading the performance of the processing system. Additionally, the amount of consumed current for performing the refresh operation increases when the refresh cycle becomes short. The short refresh cycle does not satisfies the low standby current condition required in a data retention mode of battery driving portable devices, and is not applied to the battery driving portable devices which require low power consumption.

In order to solve the problem of the refresh operation in the DRAM, a PSRAM has been used to operate the DRAM as a SRAM. In the PSRAM, a cycle for reading and writing data and a refresh cycle for performing a refresh operation are successively performed in one of memory access cycles. In other words, since the refresh operation is performed in one access cycle, the refresh can be hidden to the external access so that the DRAM may be operated as the SRAM seemingly.

FIG. 1 is a block diagram of a conventional PSRAM.

The conventional PSRAM comprises a MRS 2, a mode register control unit 4, a CRE buffer 6, a /CS1 buffer 8, a /WE buffer 10 and an address buffer 12.

The mode register control unit 4 outputs an address buffer control signal REGADDIN, a MRS write signal REGWR and a MRS update signal REGUP in response to an output signal CREIN from the CRE buffer 6, a chip selecting signal CSB outputted from the /CS1 buffer 8 and a write active signal WEB outputted from the /WE buffer 10.

The address buffer 12 directly outputs an address inputted in response to an address buffer control signal REGADDIN without address strobe latch.

FIG. 2 is a circuit diagram of the MRS 2 of FIG. 1.

The MRS 2 comprises a plurality of MRS. Each MRS comprises serially connected registers 14 and 16, inverters IV1 and IV2, and transmission gates TG1 and TG2. The transmission gate TG1 selectively transmits an address ADDREG<0> outputted from the address buffer 12 to a first register 14 in response to the MRS write signal REGWR and a signal inverted by the inverter IV1. The transmission gate TG2 selectively transmits an address outputted from the first register 14 to a second register 16 in response to a MRS update signal REGUP and a signal inverted by the inverter IV2. Here, the register 14 having an inversion latch type includes inverters IV3 and IV4, and the register 16 having an inversion latch type includes inverters IV5 and IV6.

FIG. 3 is a circuit diagram of the mode register control unit 4 of FIG. 1.

The mode register control unit 4 comprises inverters IV7, IV8 and IV9, a NAND gate ND1, a NOR gate NR1 and high pulse generators 18 and 20.

The inverter IV7 inverts the signal CREIN, the inverter IV8 inverts the write active signal WEB and the inverter IV9 inverts the chip selecting signal CSB.

The NAND gate ND1 performs a NAND operation on output signals from the inverters IV8 and IV9.

The NOR gate NR1 performs a NOR operation on output signals from the inverter IV7 and the NAND gate ND1, and outputs an address buffer control signal REGADDIN.

The first high pulse generator 18 generates a MRS update signal REGUP having a high pulse in response to the signal CREIN. The second high pulse generator 20 generates a MRS write signal REGWR having a high pulse in response to the address buffer control signal REGADDIN.

Here, the address buffer control signal REGADDIN is activated to a high level if the signal CREIN is activated to a high level when the chip selecting signal CSB is activated to a low level and the write active signal WEB is activated to a low level. That is, the NAND gate ND1 outputs a low level signal when the chip selecting signal CSB and the write active signal WEB are all at a low level. The NOR gate NR1 outputs a high level signal in response to a low level signal outputted from the NAND gate ND1 when the signal CREIN is at the high level.

The MRS write signal REGWR is generated from the high pulse generator 20 in response to the address buffer control signal REGADDIN. That is, the address buffer control signal REGADDIN is activated to a high level, delayed for a delay time of the first high pulse generator 18, and then the MRS write signal REGWR having a high pulse is generated so that an address REGADD<0:x> outputted from the address buffer 12 is written in the first register 14 of the MRS 2.

The MRS update signal REGUP is generated from the high pulse generator 18 in response to the signal CREIN. When the signal CREIN is inactivated to a low level, the first high pulse generator 18 generates the MRS update signal REGUP having a high pulse so that the address stored in the first register 14 is updated to the second register 16.

Currently, various modes such as a synchronous mode, asynchronous mode or a combined mode can be simultaneously supported to satisfy various specifications required in product market. However, since the conventional PSRAM is operated at the asynchronous mode, it cannot be used at the combined mode.

SUMMARY OF THE INVENTION

It is an object of the present invention to improve productivity with synchronous and asynchronous detecting circuits at a synchronous, asynchronous and combined mode for setting mode registers.

It is another object of the present invention to reduce the layout area by embodying in a single chip.

In an embodiment, a PSRAM having a combined synchronous and asynchronous register set comprises a MRS, a mode register control unit, a plurality of control signal buffers, an address buffer, a clock buffer, and a synchronous and asynchronous detecting unit. The MRS sets an operating mode. The mode register control unit controls the operation of the MRS. The plurality of control signal buffers buffer external control signals. The address buffer buffers an address signal. The clock buffer buffers a clock signal. The synchronous and asynchronous detecting unit detects an internal clock outputted from the clock buffer to generate an asynchronous control signal for controlling the mode register control unit. Here, the plurality of control signal buffers, the address buffer and the clock buffers are controlled by a chip selecting signal at an asynchronous mode, and are operated synchronously with respect to an internal clock outputted from the clock buffer regardless of the chip selecting signal at a synchronous mode.

BRIEF DESCRIPTION OF THE DRAWINGS

Other aspects and advantages of the present invention will become apparent upon reading the following detailed description and upon reference to the drawings in which.

DETAILED DESCRIPTION OF THE PREFERRED EMBODIMENTS

The present invention will be described in detail with reference to the accompanying drawings.

Figure 1:
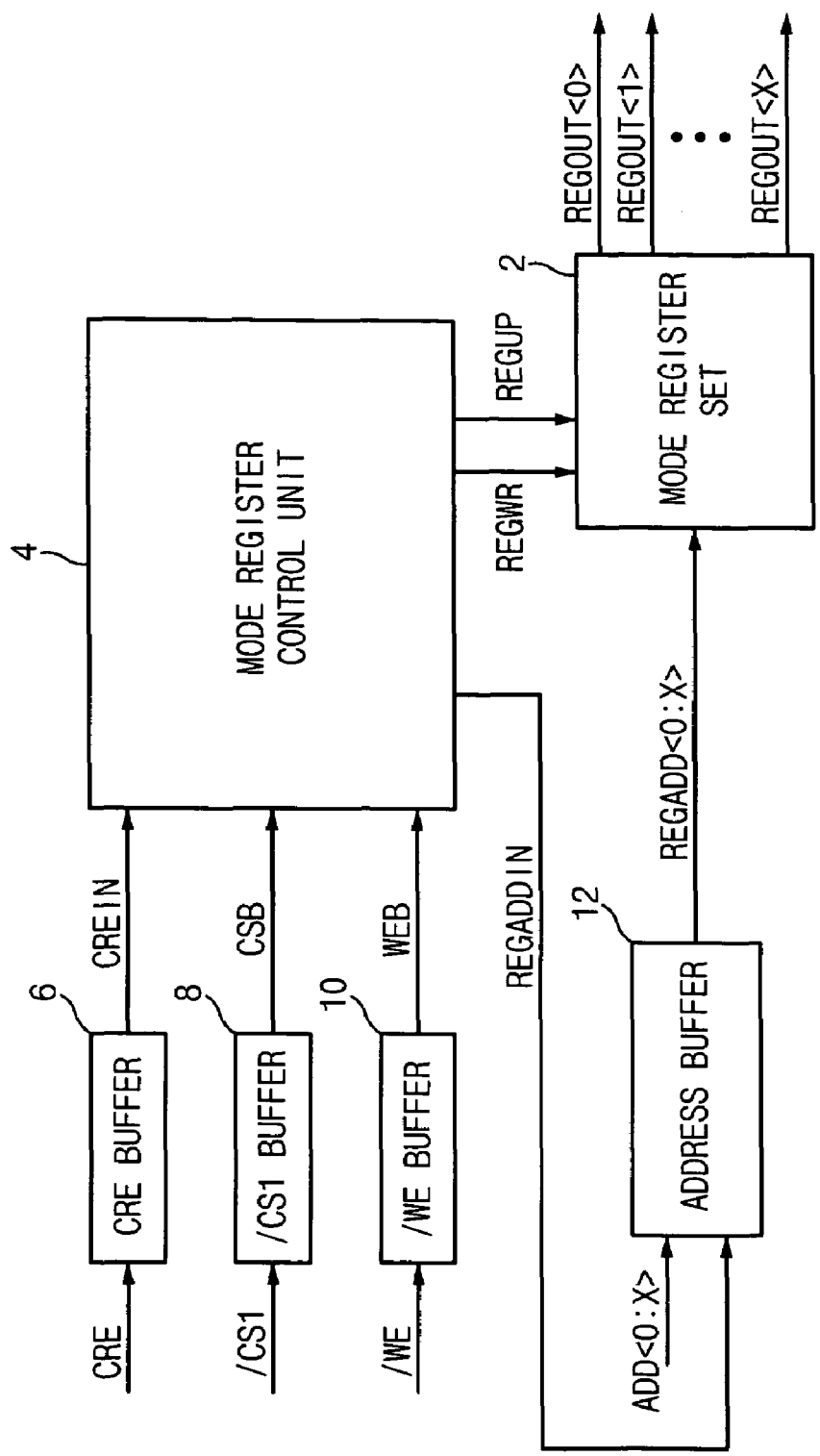
FIG. 1 is a block diagram of a conventional PSRAM.
Figure 2:
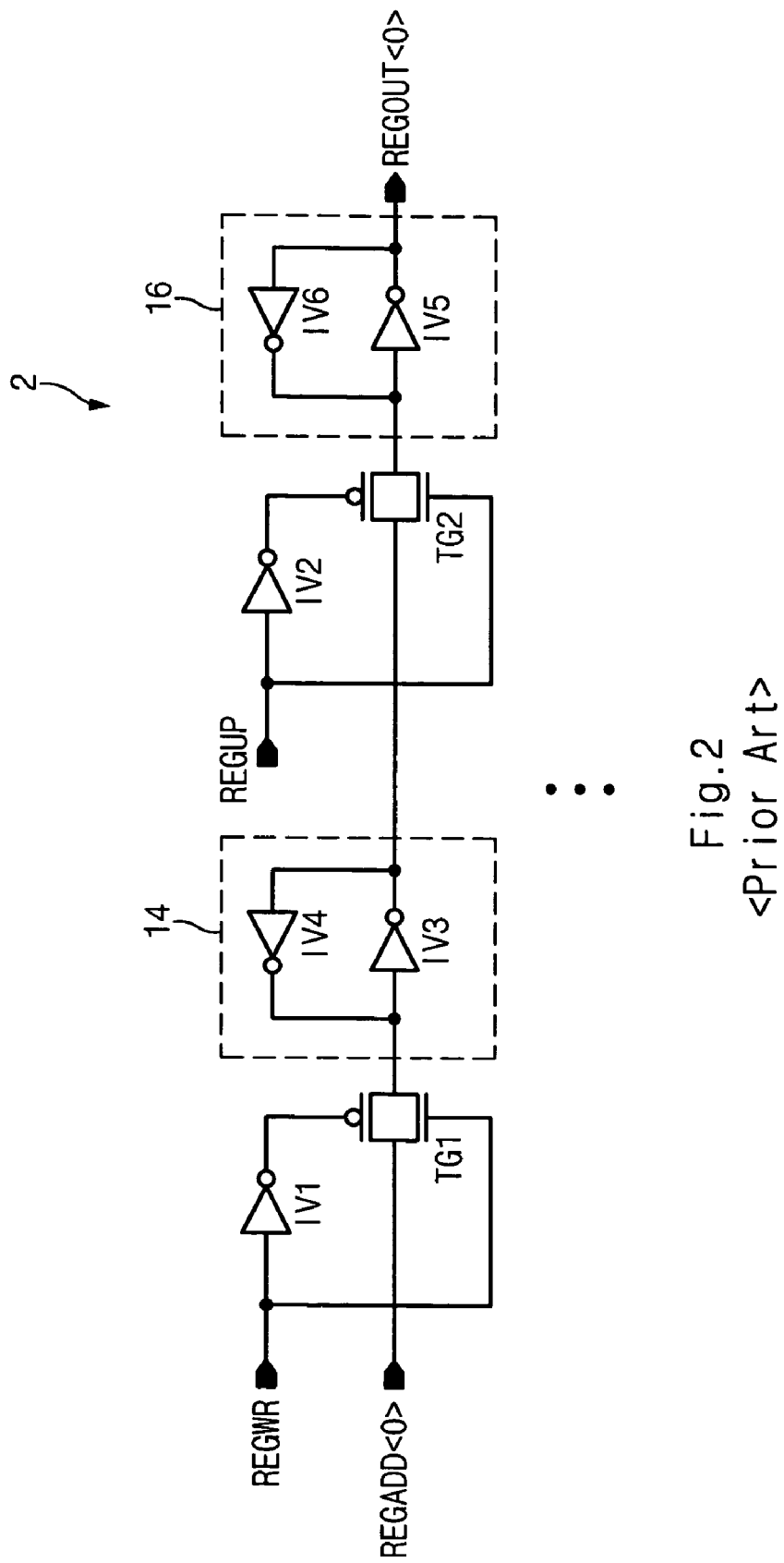
FIG. 2 is a circuit diagram of a MRS of FIG. 1.
Figure 3:
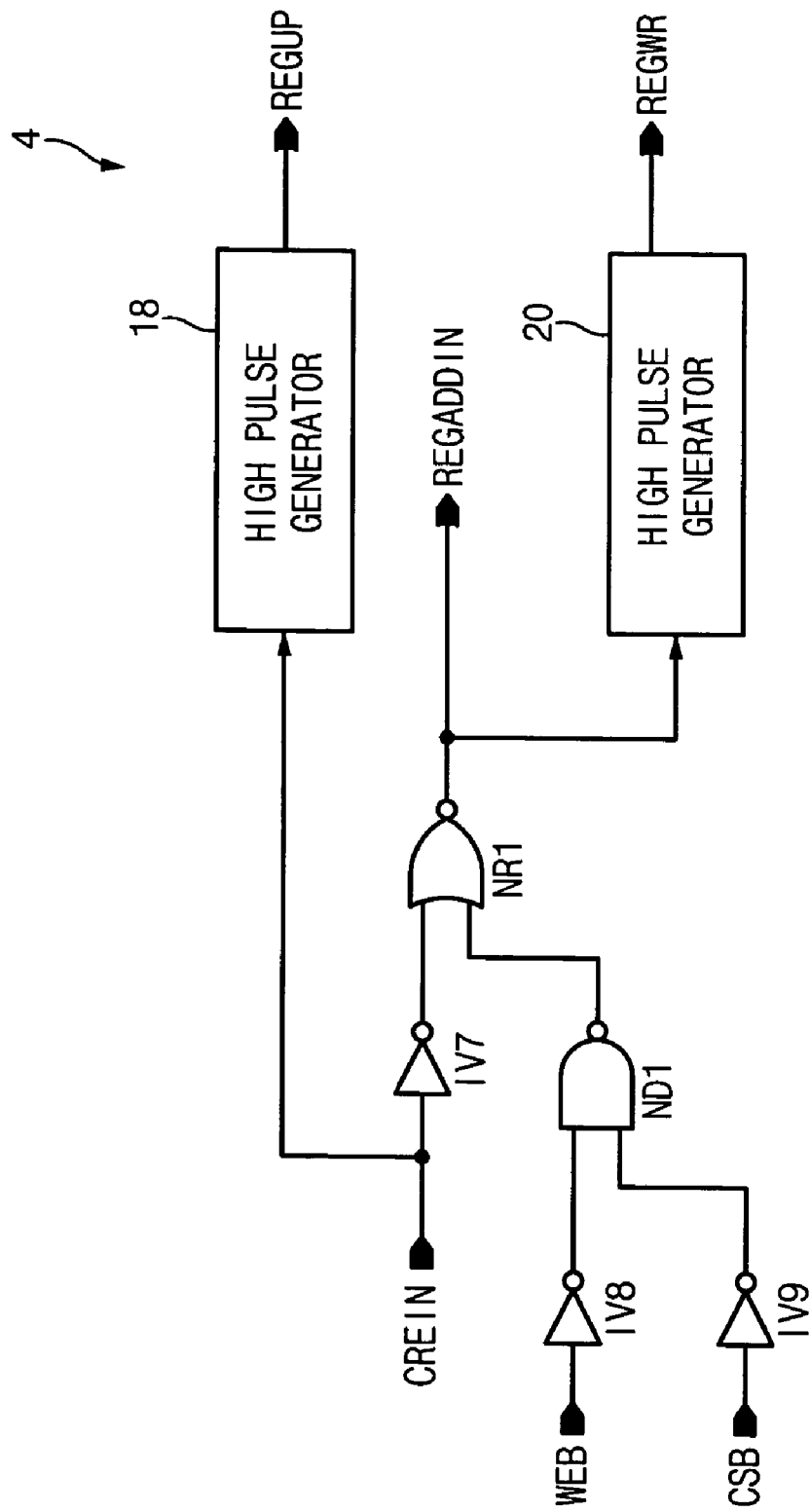
FIG. 3 is a circuit diagram of a mode register control unit of FIG. 1.
Figure 4:
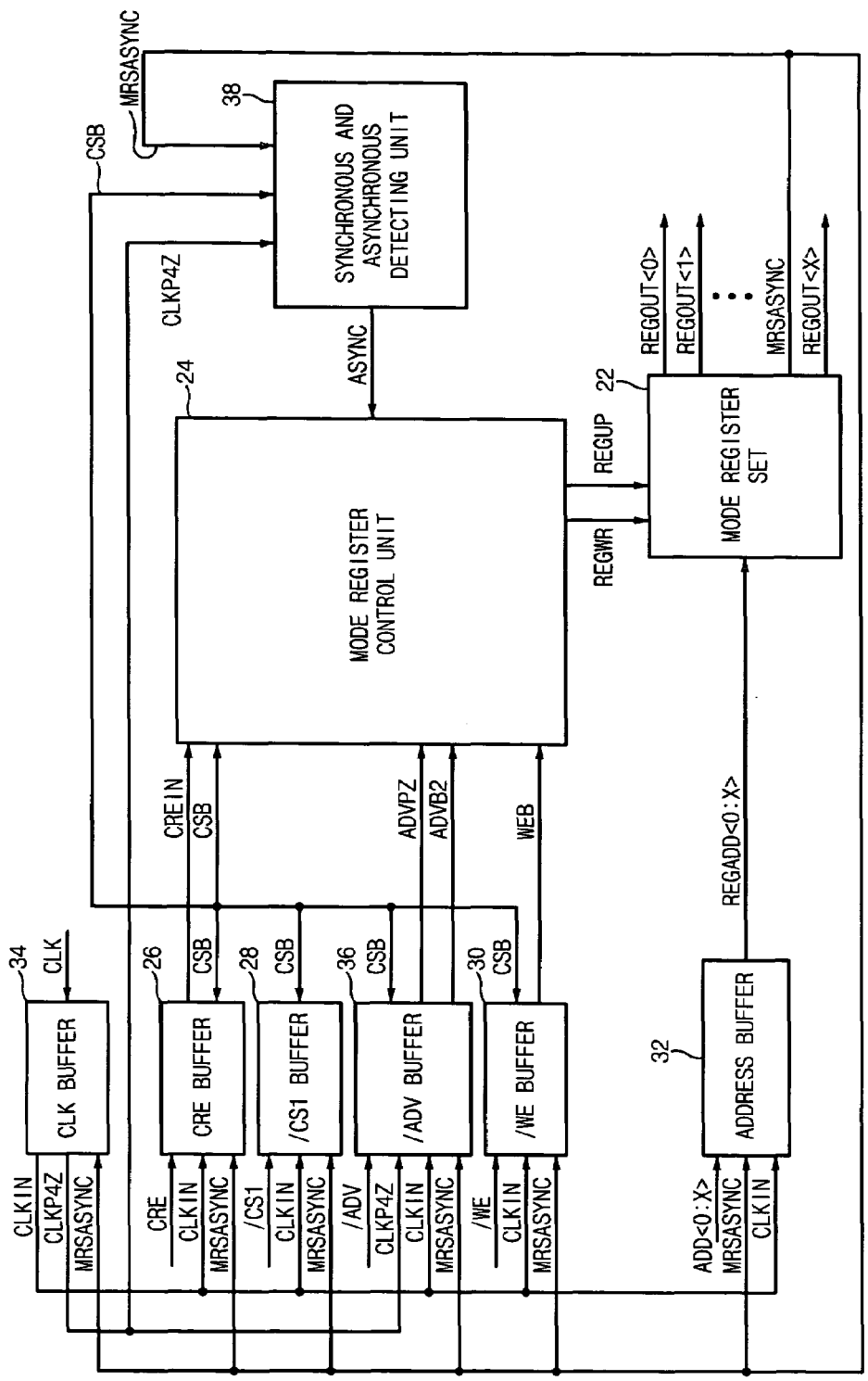
FIG. 4 is a block diagram of a PSRAM according to an embodiment of the present invention.

FIG. 4 is a block diagram of a PSRAM according to an embodiment of the present invention.

In an embodiment, the PSRAM comprises a MRS 22, a mode register control unit 24, a CRE buffer 26, a /CS1 buffer 28, a /WE buffer 30, an address buffer 32, a CLK buffer 34, a /ADV buffer 36 and a synchronous and asynchronous detecting unit 38. Here, all buffers are controlled by an output signal CSB from the /CS1 buffer 28 at an asynchronous mode, and operated synchronously with respect to an internal clock CLKIN outputted from the CLK buffer 34 regardless of the output signal CSB at a synchronous mode.

The above-described PSRAM is operated at the asynchronous or synchronous mode in response to an asynchronous set signal MRSASYNC which is a register output value outputted from the MRS 22. That is, the PSRAM is operated at the asynchronous mode if the asynchronous set signal MRSASYNC is at a low level, and is operated synchronously with respect to the clock CLK if the asynchronous set signal MRSASYNC is at a high level.

At a combined synchronous and asynchronous mode, a write mode is performed at the asynchronous mode if the asynchronous set signal MRSASYNC is at the low level and a read mode is performed synchronously with respect to the clock CLK.

If the synchronous and asynchronous detecting unit 38 receives the clock CLK before the maximum value tCSmax (i.e. 20 ns) of a setup time of a chip selecting signal /CS1, the mode registers are set at the synchronous mode. Otherwise, the asynchronous set signal MRSASYNC is set to the low level so that the mode registers are set at the asynchronous mode even when the PSRAM is operated at the synchronous mode.

Also, the synchronous and asynchronous detecting unit 38 outputs an asynchronous control signal ASYNC in response to a pulse clock CLKP4Z outputted from the CLK buffer 34, the signal CSB outputted from the /CS1 buffer 28 and the asynchronous set signal MRSASYNC. The asynchronous control signal ASYNC is constantly set at a high level if the asynchronous set signal MRSASYNC is at the high level, and at a low level when the clock CLK is inputted before the maximum value tCSmax of the setup time of the chip selecting signal /CS1 if the signal MRSASYNC is at the low level. If the clock CLK is not inputted, the signal MRSASYNC is set at the high level.

Figure 5:
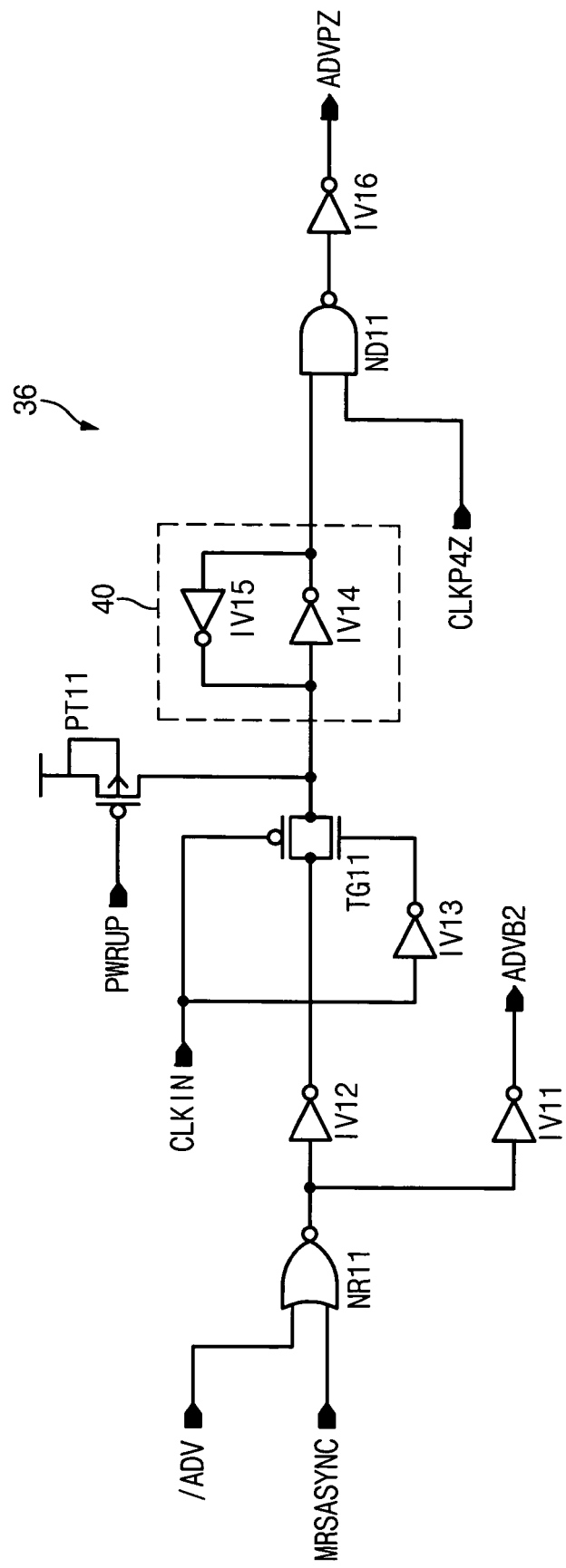
FIG. 5 is a circuit diagram of a /ADV buffer of FIG. 4.

FIG. 5 is a circuit diagram of the /ADV buffer 36 of FIG. 4.

The /ADV buffer 36 comprises a NOR gate NOR11, inverters IV11, IV12 and IV16, a transmission gate TG11, a latch unit 40, a PMOS transistor PT11 and a NAND gate ND11. The NOR gate NR11 performs a NOR operation on the valid address input detecting signal /ADV and the asynchronous set signal MRSASYNC. The inverter IV12 inverts an output signal from the NOR gate NR11. The transmission gate TG11 selectively transmits an output signal from the inverter IV12 in response to an internal clock CLKIN outputted from the CLK buffer 34 and to a signal inverted by the inverter IV13. The latch unit 40 latches a signal transmitted through the transmission gate TG11. The NAND gate ND11 performs a NAND operation on the pulse clock CLKP4Z outputted from the CLK buffer 34 and a signal latched by the latch unit 40. The inverter IV16 inverts an output signal from the NAND gate ND11 to generate a pulse valid address input detecting signal ADVPZ. Here, the latch unit 40 having an inversion latch type includes an inverter IV14 whose output terminal is connected to an input terminal of an inverter IV15.

The inverter IV11 inverts an output signal from the NOR gate NR11 to output a buffering valid address input detecting signal ADVB2. The reset PMOS transistor PT11 pulls up an input terminal of the latch unit 40 to a high level in response to a power-up signal PWRUP.

Figure 6:
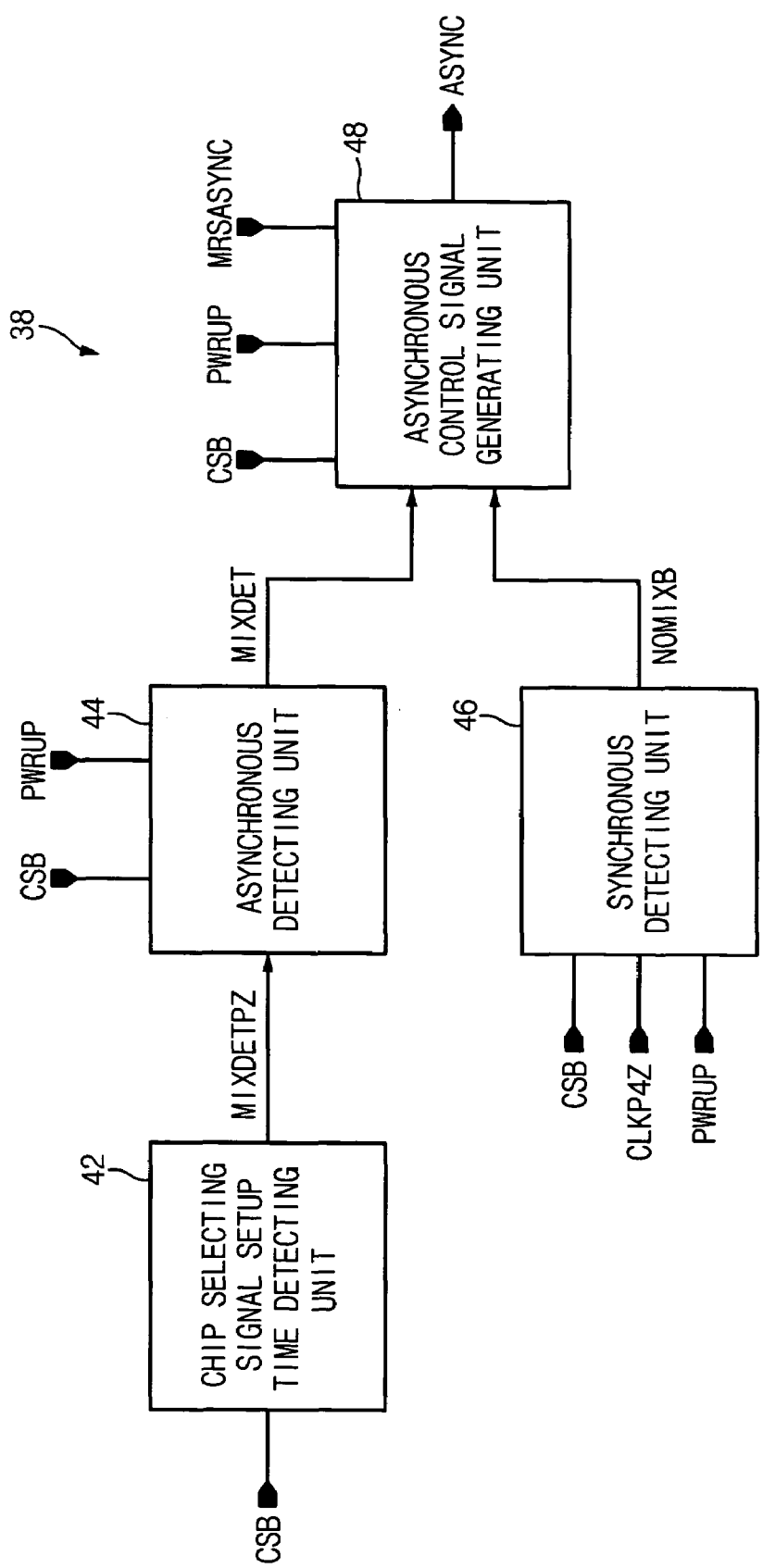
FIG. 6 is a block diagram of a synchronous and asynchronous detecting unit of FIG. 4.

FIG. 6 is a block diagram of the synchronous and asynchronous detecting unit 38 of FIG. 4.

The synchronous and asynchronous detecting unit 38 comprises a chip selecting signal detecting unit 42, an asynchronous detecting unit 44, a synchronous detecting unit 46 and an asynchronous control signal generating unit 48.

The chip selecting signal detecting unit 42 outputs a pulse signal MIXDETPZ for detecting the maximum value tCSmax of the setup time of a chip selecting signal /CS1 to the clock CLK.

The asynchronous detecting unit 44 outputs an asynchronous detecting signal MIXDET for detecting the asynchronous setting in response to the pulse signal MIXDETPZ outputted from the chip selecting signal detecting unit 42.

The synchronous detecting unit 46 outputs a synchronous detecting signal NOMIXB for detecting the synchronous setting in response to the pulse clock CLKP4Z outputted from the CLK buffer 34.

The asynchronous control signal generating unit 48 receives the asynchronous detecting signal MIXDET and the synchronous detecting signal NOMIXB to generate an asynchronous control signal ASYNC in response to the asynchronous set signal MRSASYNC.

Figure 7:
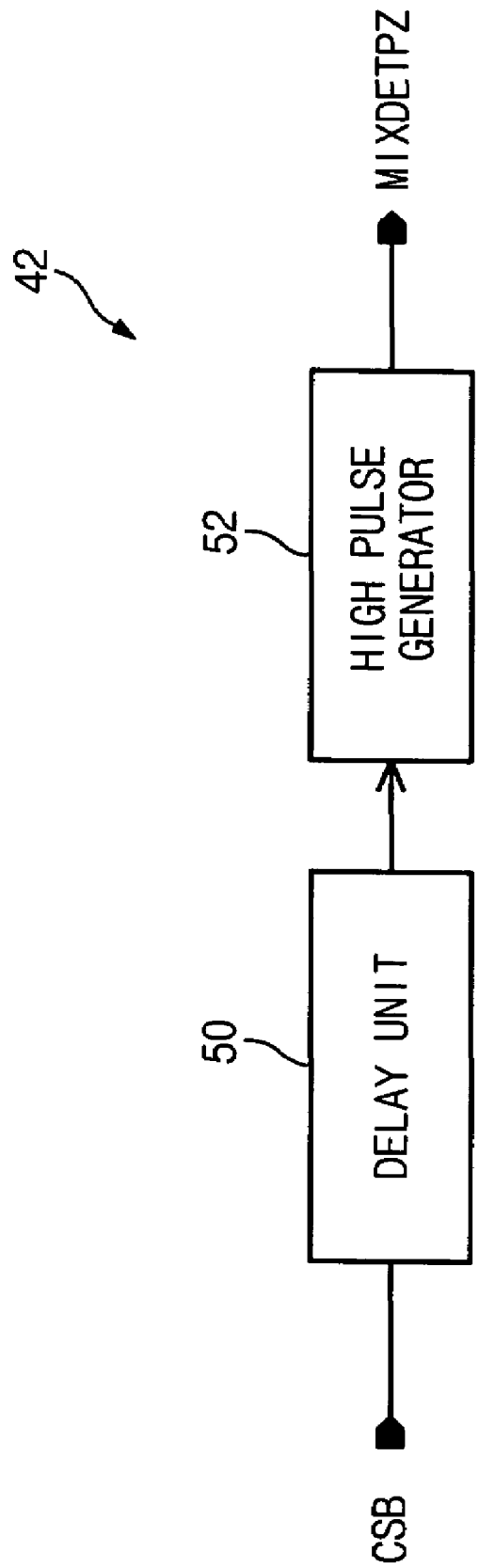
FIG. 7 is a block diagram of a chip selecting signal detecting unit of FIG. 6.

FIG. 7 is a block diagram of the chip selecting signal detecting unit 42 of FIG. 6.

The chip selecting signal detecting unit 42 comprises a delay unit 50 and a high pulse generator 52. The delay unit 50 delays the signal CSB outputted from the /CS1 buffer 28 for a predetermined time. The high pulse generator 52 generates the high pulse signal MIXDETPZ in response to an output signal from the delay unit 50. Here, the delay time of the delay unit 50 corresponds to the maximum value tCSmax of the setup time of the chip selecting signal /CS1.

As a result, when the clock CLK is inputted in an internal of the predetermined time tCSmax, the high pulse signal MIXDETPZ is generated.

Figure 8:
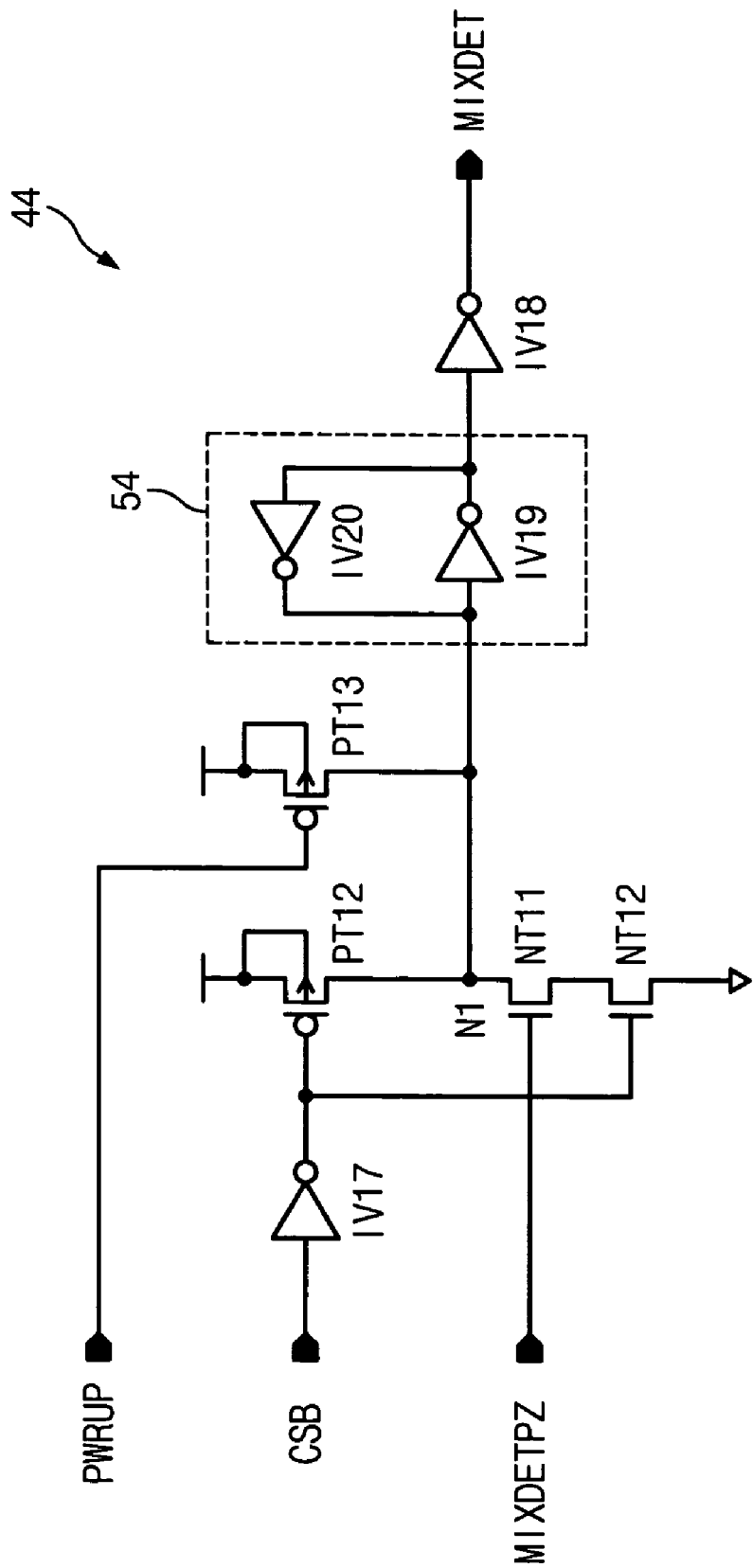
FIG. 8 is a circuit diagram of the asynchronous detecting unit of FIG. 6.

FIG. 8 is a circuit diagram of the asynchronous detecting unit 44 of FIG. 6.

The asynchronous detecting unit 44 comprises inverters IV17 and IV18, NMOS transistors NT11 and NT12 and PMOS transistors PT12 and PT13. The PMOS transistor PT12 pulls up a node N1 in response to a signal obtained by inverting the chip selecting signal CSB in the inverter IV17. The NMOS transistors NT11 and NT12 pulls down the node N1 in response to the output signal MIXDETPZ from the chip selecting signal detecting unit 42 and an output signal from the inverter IV17. The latch unit 54 latches a potential of the node N1. The inverter IV18 inverts an output signal from the latch unit 54 to output the asynchronous detecting signal MIXDET. The PMOS transistor PT13 initializes the potential of the node N1 to a high level in response to the power-up signal PWRUP. Here, the latch unit 54 having an inversion latch type includes an inverter IV19 and the inverter IV20.

Figure 9:
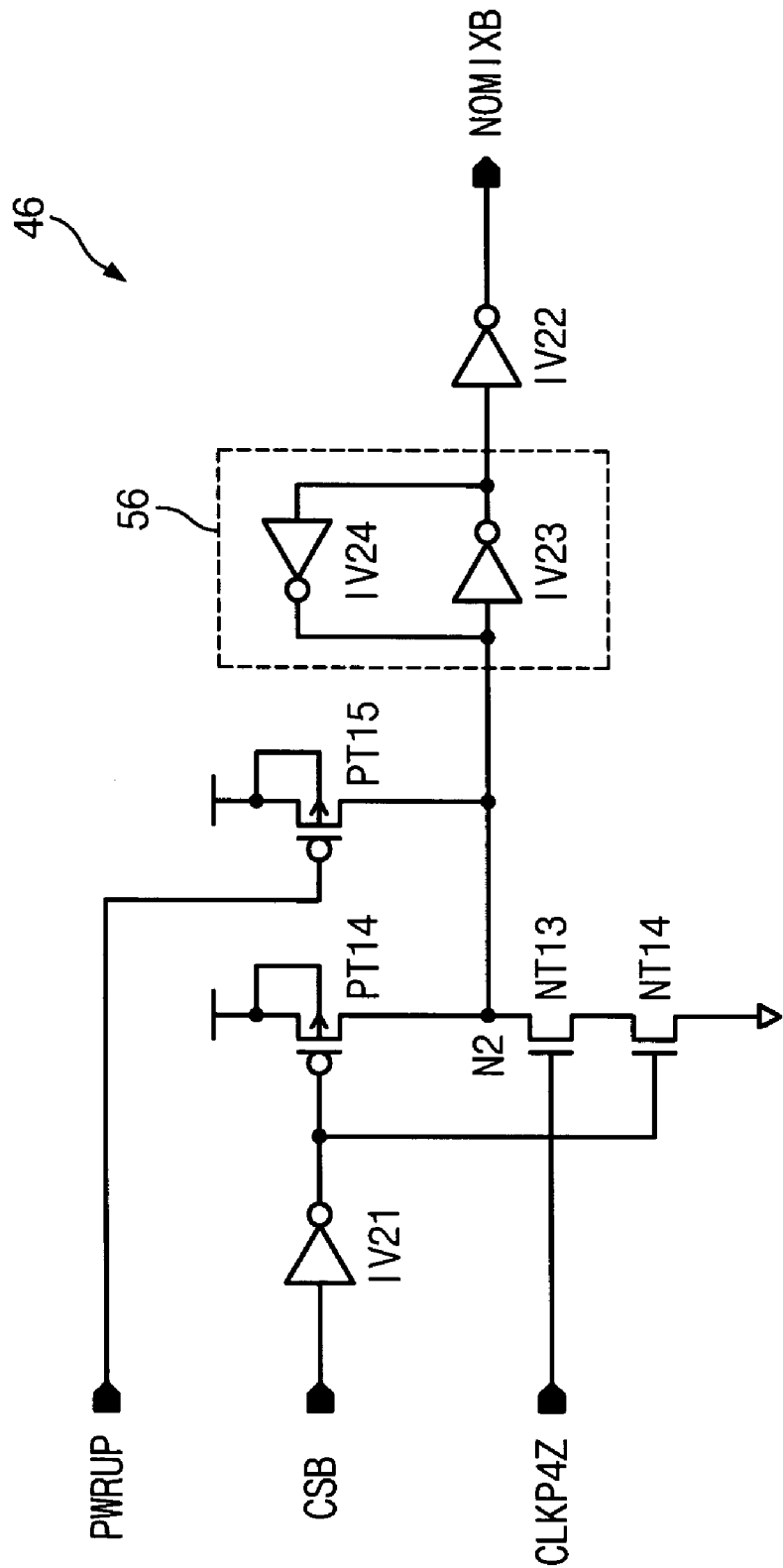
FIG. 9 is a circuit diagram of the synchronous detecting unit of FIG. 6.

FIG. 9 is a circuit diagram of the synchronous detecting unit 46 of FIG. 6.

The synchronous detecting unit 46 comprises inverters IV21 and IV22, NMOS transistors NT13 and NT14, a latch unit 56 and PMOS transistors PT14 and PT15. The PMOS transistor PT14 pulls up a node N2 in response to a signal obtained by inverting the chip selecting signal CSB in the inverter IV21. The NMOS transistors NT13 and NT14 pull down the node in response to the pulse clock CLKP4Z outputted from the CLK buffer 34 and an output signal from the inverter IV21. The latch unit 56 latches a potential of the node N2. The inverter IV22 inverts an output signal from the latch unit 56 to output the synchronous detecting signal NOMIXB. The PMOS transistor PT15 initializes the potential of the node N2 to a high level in response to the power-up signal PWRUP. Here, the latch unit 56 having an inversion latch type includes an inverter IV23 and an inverter IV24.

Figure 10:
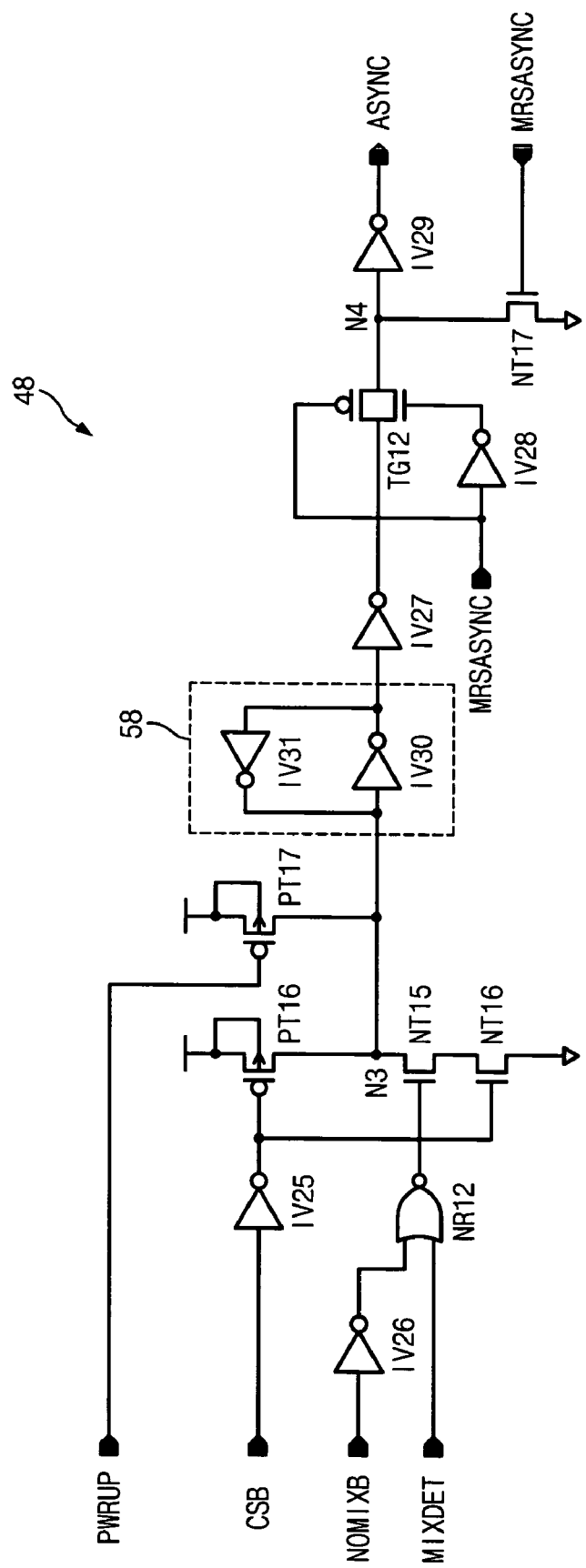
FIG. 10 is a circuit diagram of an asynchronous control signal generating unit of FIG. 6.

FIG. 10 is a circuit diagram of the asynchronous control signal generating unit 48 of FIG. 6.

The asynchronous control signal generating unit 48 comprises inverters IV25, IV26, IV27, IV28 and IV29, a NOR gate NR12, PMOS transistors PT16 and PT17, NMOS transistors NT15, NT16 and NT17, and a transmission gate TG12. The PMOS transistor PT16 pulls up a node N3 in response to a signal obtained by inverting the chip selecting signal CSB in the inverter IV25. The NOR gate NR12 performs a NOR operation on the asynchronous detecting signal MIXDET and a signal obtained by inverting the synchronous detecting signal NOMIXB in the inverter IV25. The NMOS transistors NT15 and NT16 pull down the node N3 in response to output signals from the NOR gate NR12 and the inverter IV25. The latch unit 58 latches a potential of the node N3. The inverter IV27 inverts an output signal from the latch unit 58. The transmission gate TG12 selectively transmits an output signal from the inverter IV27 in response to the asynchronous set signal MRSASYNC and a signal inverted by the inverter IV28. The inverter IV29 inverts a signal transmitted through the transmission gate TG12 to output the asynchronous control signal ASYNC. The PMOS transistor PT17 initializes the potential of the node N3 to a high level in response to the power-up signal PWRUP. The NMOS transistor NT17 initializes a potential of a node N4 to a low level in response to the asynchronous set signal MRSASYNC. Here, the latch unit 58 having an inversion latch type includes an inverter IV30 and an inverter IV31.

Figure 11:
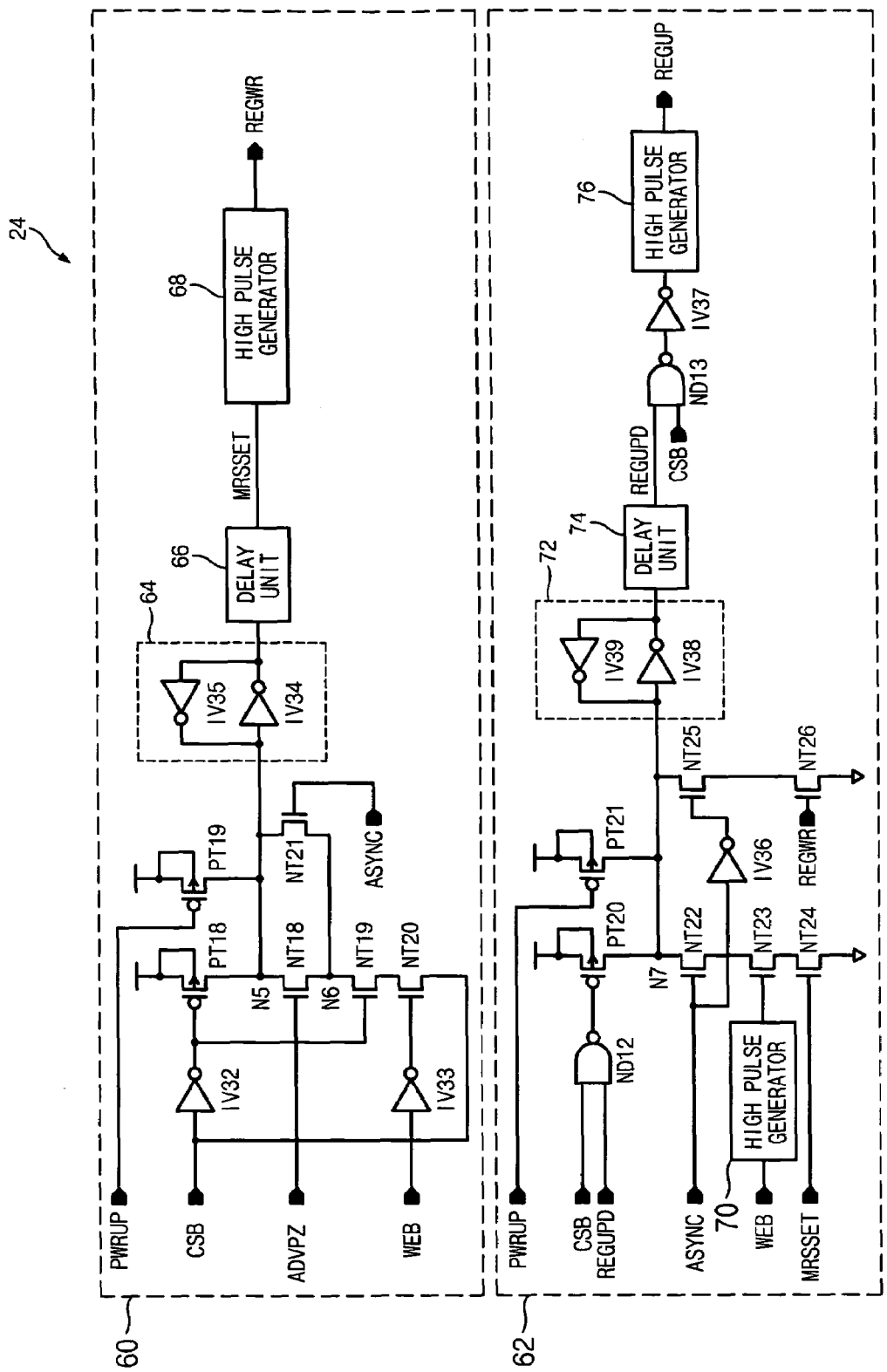
FIG. 11 is a circuit diagram of a mode register control unit of FIG. 4.

FIG. 11 is a circuit diagram of the mode register control unit 24 of FIG. 4.

The mode register control unit 24 comprises a mode register set write signal generating unit 60 and a mode register set update signal generating unit 62.

The mode register set write signal generating unit 60 comprises inverters IV32 and IV33, PMOS transistors PT18 and PT 19, NMOS transistors NT18, NT19, NT20 and NT21, a latch unit 62, a delay unit 66 and a high pulse generator 68. The PMOS transistor PT18 pulls up a node N5 in response to a signal obtained by inverting the chip selecting signal CSB in the inverter IV32. The serially connected NMOS transistors NT18, NT19 and NT20 apply the chip selecting signal CSB to the node N5 in response to the pulse signal ADVPZ outputted from the /ADV3 buffer 36, an output signal CREIN from the CRE buffer 26 and a signal obtained by inverting a write active signal WEB in the inverter IV33. The NMOS transistor NT21 connects the node N5 to a node N6 in response to the asynchronous control signal ASYNC. The latch unit 64 latches a potential of the node N5. The delay unit 66 delays an output signal from the latch unit 64 for a predetermined time. The high pulse generator 68 outputs a mode register set write signal REGWR having a high pulse in response to an output signal MRSSET from the delay unit 66. Here, the latch unit 64 having an inversion latch type includes an inverter IV34 and an inverter IV35.

The mode register set update signal generating unit 62 comprises NAND gates ND12 and ND13, PMOS transistors PT20 and PT21, high pulse generators 70 and 76, NMOS transistors NT22, NT23, NT24, NT25 and NT26, an inverter IV37, a latch unit 72, and a delay unit 74. The NAND gate ND12 performs a NAND operation on the chip selecting signal CSB and an output signal from the delay unit 74. The PMOS transistor PT20 pulls up a node N7 in response to an output signal from the NAND gate ND12. The high pulse generator 70 generates a high pulse in response to the write active signal WEB. The serially connected NMOS transistors NT22, NT23 and NT24 connect the node N7 to a ground terminal in response to the asynchronous control signal ASYNC, an output signal from the high pulse generator 70, and an output signal MRSSET from the delay unit 66 of the mode register set write signal generating unit 60. The connected serially NMOS transistors NT25 and NT26 connect the node N7 to the ground terminal in response to a signal obtained by inverting the asynchronous control signal ASYNC in the inverter IV36 and a mode register set write signal REGWR. The latch unit 72 latches a potential of the node N7. The delay unit 74 delays an output signal from the latch unit 72 for a predetermined time. The NAND gate ND13 performs a NAND operation on an output signal REGUPD from the delay unit 74 and the chip selecting signal CSB. The inverter IV37 inverts an output signal from the NAND gate ND13. The high pulse generator 76 outputs a mode register set update signal REGUP having a high pulse in response to an output signal from the inverter IV37. Here, the latch unit 72 having an inversion latch type includes an inverter IV38 and an inverter IV39.

Figure 12:
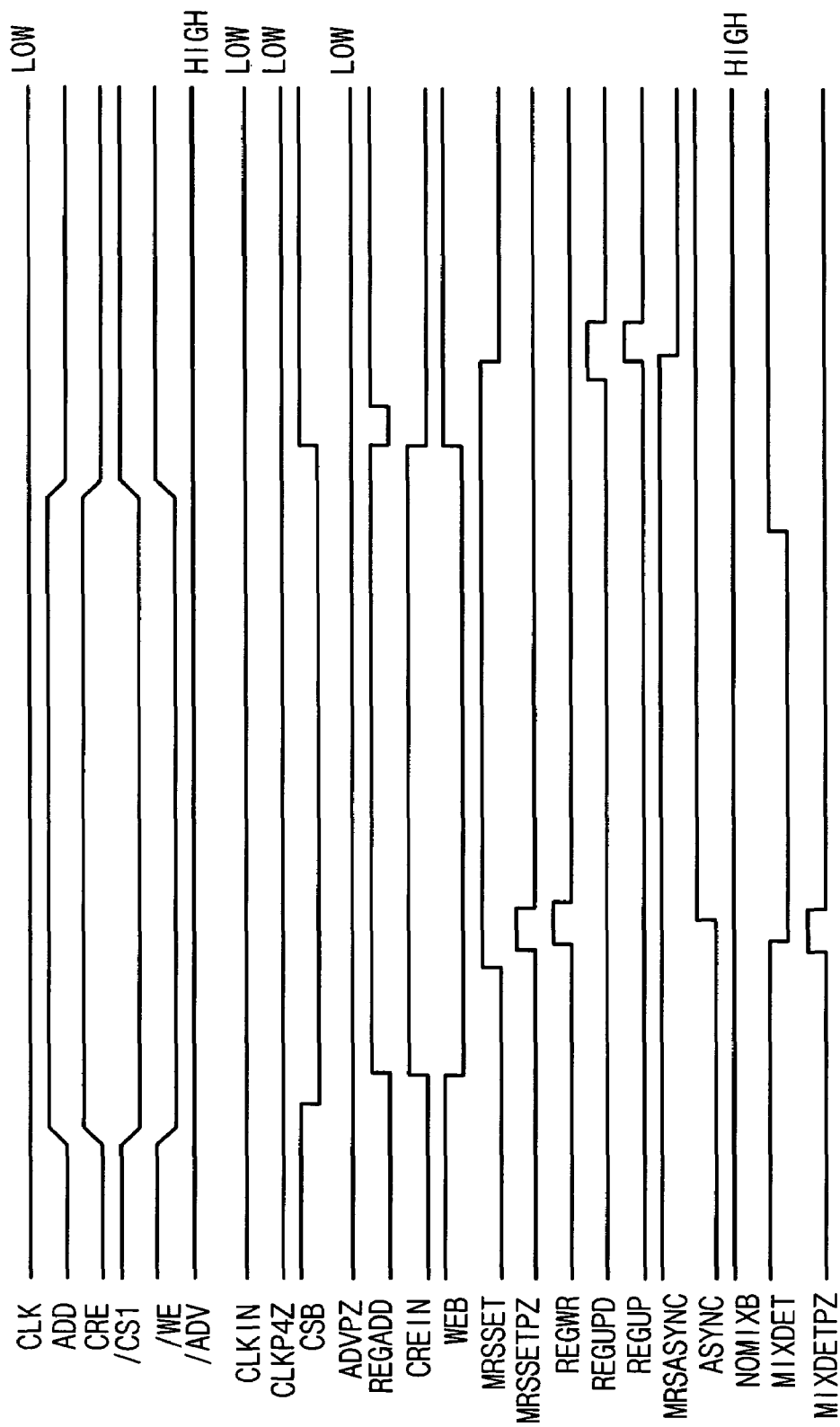
FIG. 12 is a timing diagram illustrating the operation of the PSRAM of FIG. 4 when an asynchronous mode is changed into a synchronous mode.

FIG. 12 is a timing diagram illustrating the operation of the PSRAM of FIG. 4 when an asynchronous mode is changed into a synchronous mode.

At the asynchronous mode, since the asynchronous set signal MRSASYNC is at the high level, the asynchronous control signal ASYNC constantly becomes at the high level.

Here, if the CREIN signal is enabled to the high level, and the chip selecting signal CSB and the write active signal WEB are activated to a low level, the output signal MRSSET from the delay unit 66 of the mode register set write signal generating unit 60 becomes at a high level.

As a result, the mode register set write signal REGWR having a high pulse is generated, an address REGADD outputted from the address buffer 32 is written in a first register 14 of a mode register set 22.

Meanwhile, if the signals CSB and WEB are at a high level, the asynchronous control signal ASYNC becomes at the high level so that the synchronous mode is set. Then, the mode register set update signal REGUP is generated, and an address stored in the first register 14 of the mode register set 22 is updated to a second register 16.

Figure 13:
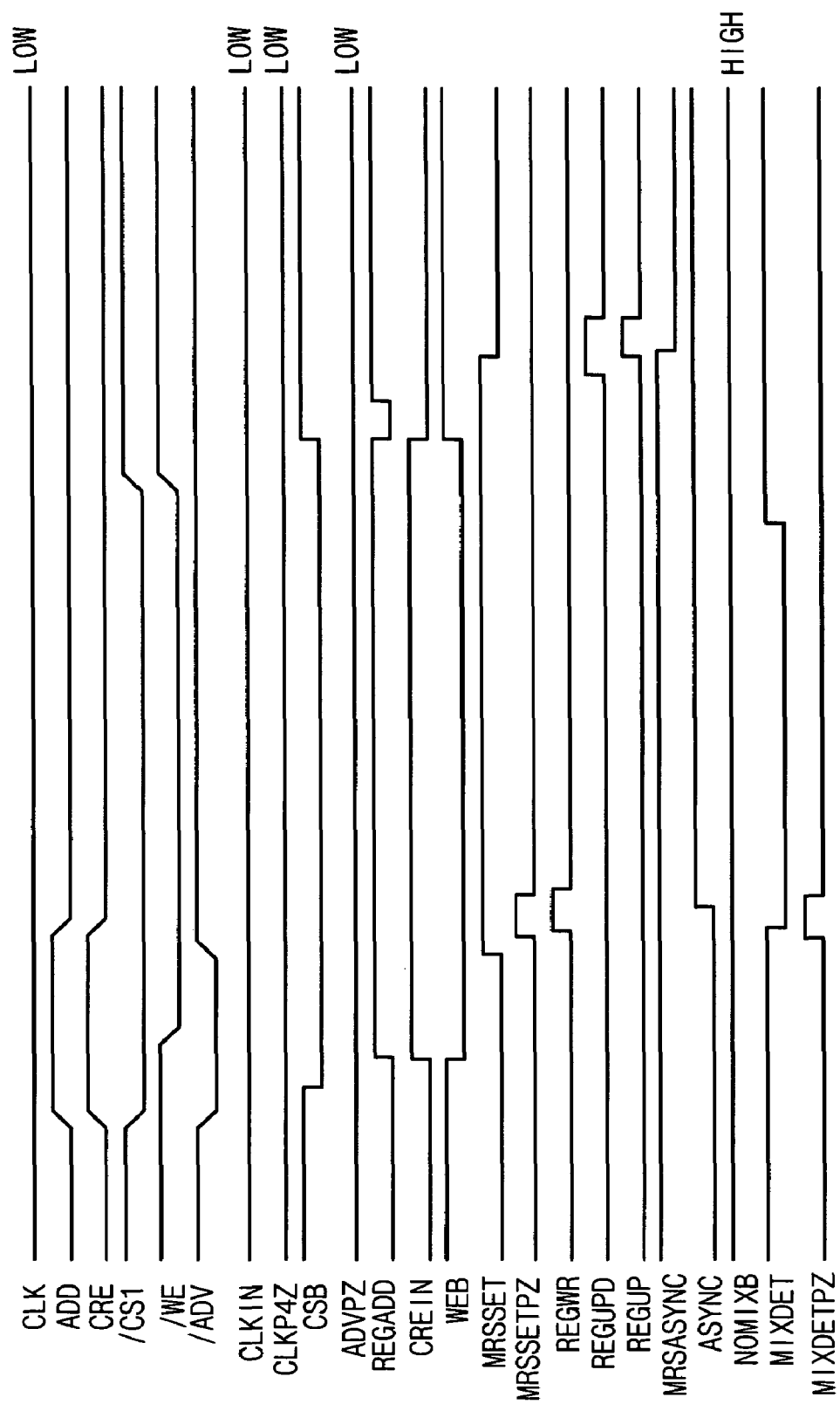
FIG. 13 is a timing diagram illustrating the operation of the PRSAM of FIG. 4 when a combined mode is changed to the asynchronous mode.

FIG. 13 is a timing diagram illustrating the operation of the PRSAM of FIG. 4 when a combined mode is changed to the asynchronous mode.

At the combined mode, since the pulse clock CLKP4Z is at a low level, the signal NOMIXB is at a high level and the signal MIXDET becomes at a low level by a high pulse.

Here, since the asynchronous set signal MRSASYNC and the signal CSB are at the low level, the asynchronous control signal ASYNC becomes at the high level.

Meanwhile, if the signal CREIN is enabled to a high level and the chip selecting signal CSB and the write active signal WEB are activated to the low level, the output signal MRSSET from the delay unit 66 of the mode register set write signal generating unit 60 becomes at a high level.

AS a result, the mode register set write signal REGWR having a high pulse is generated, and the address REGADD outputted from the address buffer 32 is written in the first register 14 of the mode register set 22.

Meanwhile, if the signals CSB and WEB are at the high level, the mode register set update signal REGUP is generated so that the address stored in the first register 14 of the mode register set 22 is updated to the second register 16. Also, the asynchronous set signal MRSASYNC becomes at the high level so that the asynchronous mode is set.

Figure 14:
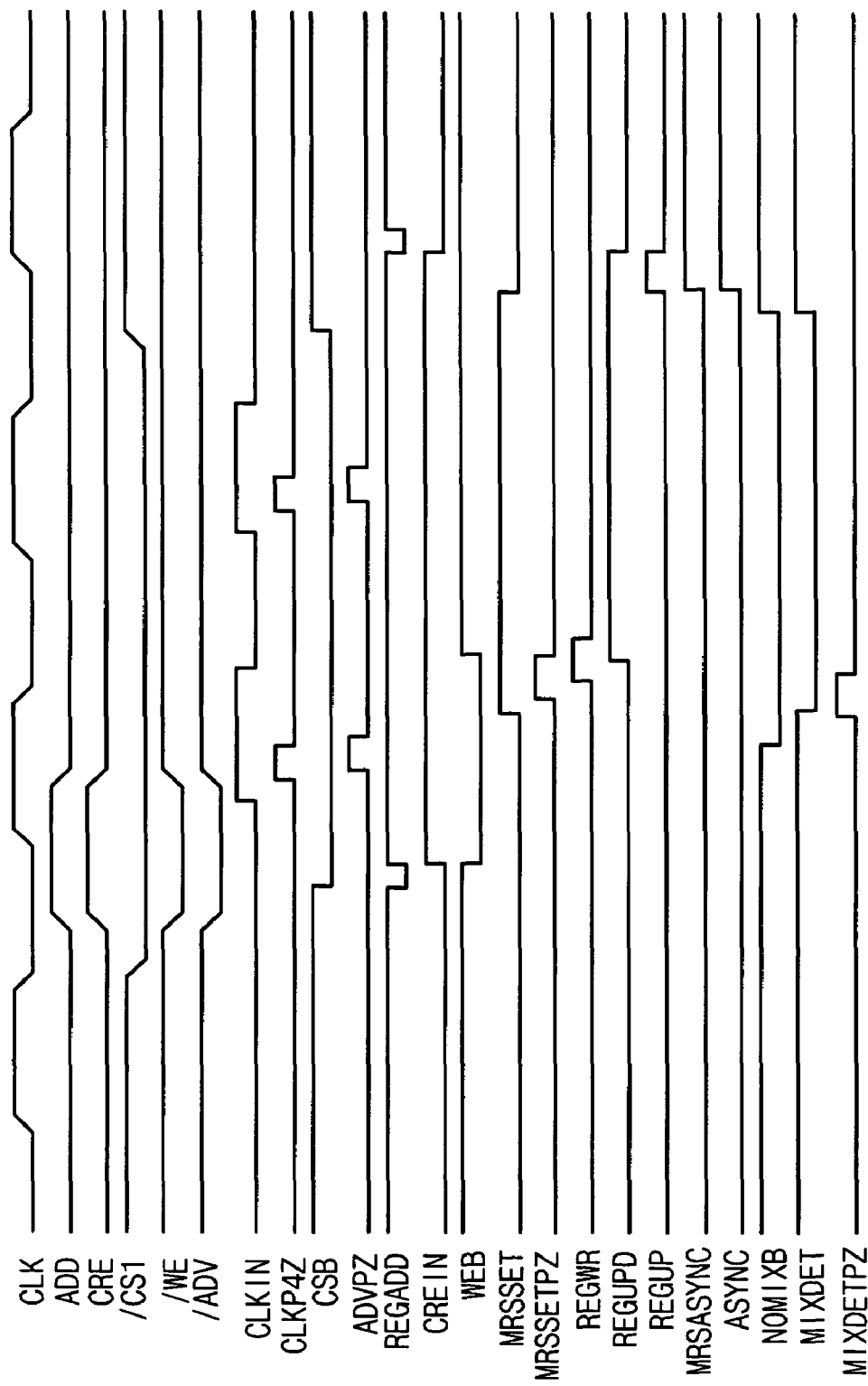
FIG. 14 is a timing diagram illustrating the operating of the PSRAM of FIG. 4 when the synchronous mode is changed into the asynchronous mode.

FIG. 14 is a timing diagram illustrating the operating of the PSRAM of FIG. 4 when the synchronous mode is changed into the asynchronous mode.

At the synchronous mode, since the asynchronous set signal MRSASYNC is at the low level and the signal CSB is at the high level, the asynchronous control signal ASYNC becomes at the low level.

The signals CSB and WEB are generated synchronously with respect to the clock CLK. Then, the /ADV buffer 36 generates a strobe signal ADVPZ having a high pulse synchronized with respect to the pulse clock CLKP4Z so that the mode register set write signal REGWR becomes at a high level.

If the mode register set write signal REGWR becomes at the high level, the signal REGUPD delayed by the delay unit 74 becomes at a high level. If the signal CSB becomes at the high level, the mode register set update signal REGUP having a high pulse is generated so that a register value is finally updated. Then, the asynchronous set signal MRSASYNC is at the high level and the asynchronous control signal ASYNC is at the high level so that the asynchronous mode is set.

As discussed earlier, a PSRAM according to an embodiment of the present invention can improve productivity because the mode register setting is possible with synchronous and asynchronous detecting circuits at a combined synchronous and asynchronous mode.

Additionally, the PSRAM is embodied in a single chip, thereby reducing the layout area.

While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A PSRAM having a combined synchronous and asynchronous register set, comprising:
   a MRS for setting an operating mode;
   a mode register control unit for controlling the operation of the MRS;
   a plurality of control signal buffers for buffering external control signals;
   an address buffer for buffering an address signal;
   a clock buffer for buffering a clock signal; and
   a synchronous and asynchronous detecting unit for detecting an internal clock outputted from the clock buffer to generate an asynchronous control signal for controlling the mode register control unit at a synchronous, asynchronous and combined mode, wherein the plurality of control signal buffers, the address buffer and the clock buffers are controlled by a chip selecting signal at an asynchronous mode, and are operated synchronously with respect to an internal clock outputted from the clock buffer regardless of the chip selecting signal at a synchronous mode.

2. The PSRAM according to claim 1, wherein the plurality of control signal buffers comprises:
 a CRE buffer for buffering a signal CRE;
 a /CS1 buffer for buffering a chip selecting signal /CS1;
 a /WE buffer for buffering a write active signal /WE; and
 a /ADV buffer for buffering an valid address input detecting signal /ADV.

3. The PSRAM according to claim 1, wherein the mode register control unit comprises:
 a mode register set write signal generating unit for generating a MRS write signal to control the operation of storing an address signal outputted from the address buffer in the MRS; and
 a mode register set update signal generating unit for generating a MRS update signal to control the operation of updating the address signal stored in the MRS.

4. The PSRAM according to claim 3, wherein the mode register set write signal generating unit is controlled by control signals outputted from the plurality of control signal buffers, and generate the MRS write signal in response to the asynchronous control signal.

5. The PSRAM according to claim 4, wherein the mode register set write signal generating unit further comprises a latch unit for maintaining a potential of an output terminal.

6. The PSRAM according to claim 4, wherein the mode register set write signal generating unit further comprises a pulse generator for generating a pulse when the potential of the output terminal is changed.

7. The PSRAM according to claim 3, wherein the mode register set update signal generating unit generates the MRS update signal in response to the control signals outputted from the plurality of control signal buffers.

8. The PSRAM according to claim 7, wherein the mode register set update signal generating unit further comprises a latch unit for maintaining a potential of an output terminal.

9. The PSRAM according to claim 7, wherein the mode register set update signal generating unit further comprises a pulse generator for generating a pulse when the potential of the output terminal is changed.

10. The PSRAM according to claim 2, wherein the synchronous and asynchronous detecting unit comprises:
 an asynchronous detecting unit for generating an asynchronous detecting signal at an asynchronous mode;
 a synchronous detecting unit for generating a synchronous detecting signal at a synchronous mode; and
 an asynchronous control signal generating unit for generating the asynchronous control signal in response to the asynchronous detecting signal and the synchronous detecting signal.

11. The PSRAM according to claim 10, wherein the asynchronous detecting unit generates the asynchronous detecting signal in response to output signals from the /CS1 buffer.

12. The PSRAM according to claim 11, wherein the asynchronous detecting unit further comprises a latch unit for maintaining a potential of an output terminal.

13. The PSRAM according to claim 10, wherein the synchronous detecting unit generates the synchronous detecting signal in response to output signals from the /CS1 buffer and the clock buffer.

14. The PSRAM according to claim 13, wherein the synchronous detecting unit further comprises a latch unit for maintaining a potential of an output terminal.

15. The PSRAM according to claim 10, wherein the asynchronous control signal generating unit generates the asynchronous control signal in response to the output signal from the /CS1 buffer, the asynchronous detecting signal and the synchronous detecting signal.

16. The PSRAM according to claim 15, wherein the asynchronous control signal generating unit further comprises a latch unit for maintaining a potential of an output terminal.

17. The PSRAM according to claim 16, wherein the asynchronous control signal generating unit further comprises a transmission unit for selectively transmitting an output signal from the latch unit in response to an output signal from the MRS.

18. The PSRAM according to claim 15, wherein the asynchronous control signal generating unit further comprises an initialization unit for initializing the potential of the output terminal to a previously set potential in response to the output signal from the MRS.

* * * * *